(12) United States Patent
Bolander et al.

(10) Patent No.: US 7,055,121 B1
(45) Date of Patent: May 30, 2006

(54) METHOD, SYSTEM, AND COMPUTER PROGRAM PRODUCT FOR DESIGNING AN INTEGRATED CIRCUIT USING SUBSTITUTION OF STANDARD CELLS WITH SUBSTITUTE CELLS HAVING DIFFERING ELECTRICAL CHARACTERISTICS

(75) Inventors: Jarie Bolander, Redwood City, CA (US); Steven P. Larky, Del Mar, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/256,502

(22) Filed: Sep. 26, 2002

(51) Int. Cl.
*G06F 17/50* (2006.01)

(52) U.S. Cl. .................. 716/11; 716/4; 716/6; 716/10

(58) Field of Classification Search ............. 716/1–6, 716/8–14, 18
See application file for complete search history.

(56) References Cited

U.S. PATENT DOCUMENTS

| | | | | |
|---|---|---|---|---|
| 5,459,673 | A * | 10/1995 | Carmean et al. ............. | 716/6 |
| 5,666,288 | A * | 9/1997 | Jones et al. .................. | 716/17 |
| 5,724,250 | A * | 3/1998 | Kerzman et al. ............. | 716/3 |
| 5,764,525 | A * | 6/1998 | Mahmood et al. ............ | 716/18 |
| 5,872,717 | A * | 2/1999 | Yu et al. ...................... | 716/6 |
| 5,880,967 | A * | 3/1999 | Jyu et al. ..................... | 716/6 |
| 6,275,973 | B1 * | 8/2001 | Wein ........................... | 716/10 |
| 6,470,476 | B1 * | 10/2002 | Bednar et al. ................ | 716/2 |
| 6,505,322 | B1 * | 1/2003 | Yamashita et al. ............ | 716/1 |
| 6,564,364 | B1 * | 5/2003 | Dahl et al. ................... | 716/11 |
| 6,574,786 | B1 * | 6/2003 | Pohlenz et al. ............... | 716/17 |
| 2002/0069396 | A1 * | 6/2002 | Bhattacharya et al. ........ | 716/7 |

* cited by examiner

*Primary Examiner*—Leigh M. Garbowski
(74) *Attorney, Agent, or Firm*—Brownstein Hyatt & Farber, P.C.

(57) ABSTRACT

A method, system, and computer program product for designing an integrated circuit. In one example, a standard library is provided having a plurality of standard circuit cells, and a substitute library is provided having a plurality of substitute circuit cells wherein one or more substitute circuit cells correspond to one or more standard circuit cells and the one or more substitute circuit cells have at least one differing electrical characteristic—such as power consumption, quiescent current consumption, speed/response time, leakage current, etc.—than the corresponding one or more standard circuit cells. An initial circuit design is created using the plurality of standard circuit cells of the standard library; and one or more non-critical timing paths are identified in the initial circuit design, the non-critical timing paths including one or more standard circuit cells. The one or more standard circuit cells in at least one of the non-critical timing paths of the initial circuit design are replaced with one or more substitute circuit cells to form a modified integrated circuit design. The replacement operation may occur after standard circuit cells of the initial circuit design have been placed and routed. In this manner, the modified circuit design may include standard cells on the critical timing paths and substitute cells on the non-critical timing paths wherein the standard cells are faster and the substitute cells consume less power and/or less quiescent current, in one example.

19 Claims, 2 Drawing Sheets

METHOD, SYSTEM, AND COMPUTER
PROGRAM PRODUCT FOR DESIGNING AN
INTEGRATED CIRCUIT USING
SUBSTITUTION OF STANDARD CELLS
WITH SUBSTITUTE CELLS HAVING
DIFFERING ELECTRICAL
CHARACTERISTICS

TECHNICAL FIELD

This application relates, in general, to designing integrated circuits.

BACKGROUND

In the design of integrated circuits, designers utilize libraries of pre-designed versions of commonly used electrical circuits, elements, or blocks. Such libraries are known as standard cell libraries and contain various standard cells—including standard circuits or blocks such as flip-flops, inverters, NAND gates, XOR gates, adders, etc. For instance in a digital design, a library may contain a standard cell design for an XOR gate which has, as part of the standard cell design, the underlying transistors of the XOR gate already interconnected. In this manner, a designer merely selects the standard cell of an XOR gate to use in the design, without having to spend time designing the XOR gate at the transistor level.

In the design of an overall integrated circuit, a large number of various standard cells are connected together. A typical standard cell library may have 200 or so different types of standard cells, and a circuit design may involve numerous standard cells, such as 30,000 cells or even 1,000,000 or more cells.

As recognized by the present inventors, one problem in the design of integrated circuits, particularly complex integrated circuits, is that once the standard cells for a circuit design have been selected, the designer may wish to adjust the electrical characteristics of the circuit design.

Accordingly, as recognized by the present inventors, what is needed is a method for designing an integrated circuit which permits systematic substitution of standard cells with substitute cells having differing electrical characteristics, preferably without adversely affecting the speed characteristics of the resulting integrated circuit design.

It is against this background that various embodiments of the present invention were developed.

SUMMARY

According to one broad aspect of one embodiment of the present invention, disclosed herein is a method for designing an integrated circuit. In one example, the method includes providing a first library having a plurality of standard circuit cells and providing a second library having a plurality of substitute circuit cells. One or more substitute circuit cells may correspond to one or more standard circuit cells, and the one or more substitute circuit cells have at least one differing electrical characteristic than the corresponding one or more standard circuit cells. The method may also include creating an initial circuit design using the plurality of standard circuit cells of the first library; identifying one or more non-critical timing paths in the initial circuit design, the non-critical timing paths including one or more standard circuit cells; and substituting the one or more standard circuit cells in at least one of the non-critical timing paths of the initial circuit design with one or more substitute circuit cells to form a modified integrated circuit design. In this manner, the modified circuit design may include standard cells on the critical timing paths and substitute cells on the non-critical timing paths, in one example.

In another embodiment, the standard circuit cells include a first set of transistors having a plurality of electrical characteristics, and the substitute circuit cells corresponding to the standard circuit cells include a second set of transistors having a plurality of electrical characteristics, the electrical characteristics of the first set of transistors being different from the electrical characteristics of the second set of transistors. The electrical characteristics may include an amount of power consumed during operations, an amount of quiescent or bias current used, and/or a response time. In one example, the amount of power consumed by the second set of transistors is lower than the amount of power consumed by the first set of transistors, the amount of quiescent current used by the second set of transistors is lower than the amount of quiescent current used by the first set of transistors, and/or the response time of the first set of transistors is faster than the response time of the second set of transistors. In this manner, the modified circuit design may include standard cells on the critical timing paths and substitute cells on the non-critical timing paths wherein the standard cells are faster and the substitute cells consume less power and/or less quiescent current, in one example.

In another embodiment, the standard circuit cells include a first set of transistors having a first type of implant (i.e., an N-core implant) and the substitute circuit cells corresponding to the standard cells include a second set of transistors having a second type of implant (i.e., a modified N-core implant), the second type of implant being different from the first type of implant (i.e., the modified N-core making the second set of transistors exhibit lower leakage properties when compared with the first set of transistors).

In one example, the standard circuit cells include transistors configured to perform a logical function, and the substitute circuit cells corresponding to the standard cells include transistors configured to perform the identical or substantially similar logical function.

In one embodiment, the providing a second library may include copying the plurality standard circuit cells of the first library, wherein the standard circuit cells include a first set of transistors having a plurality of electrical characteristics; and replacing the first set of transistors with a second set of transistors having a plurality of electrical characteristics (such as power consumption, quiescent current consumption, speed, leakage currents, etc.) being different from the electrical characteristics of the first set of transistors.

The operation of providing for identifying one or more non-critical timing paths in the initial circuit design may include performing a static timing analysis of the initial circuit design to determine critical and/or non-critical timing paths of the initial circuit design.

In another embodiment, the method may also include placing and routing the standard circuit cells of the initial circuit design, and substituting the one or more standard circuit cells after the placing and routing has occurred. Further, the modified circuit design may be evaluated in order to determine whether the modified circuit design performs in a manner consistent with the initial circuit design.

According to one broad aspect of one embodiment of the present invention, disclosed herein is a system for designing an integrated circuit including a standard library and a substitute library. In one example, the standard library has a plurality of standard circuit cells and the substitute library has a plurality of substitute circuit cells wherein one or more substitute circuit cells correspond to one or more standard circuit cells and the one or more substitute circuit cells have at least one differing electrical characteristic than the corresponding one or more standard circuit cells. The system may also include a module for creating an initial circuit design using the plurality of standard circuit cells of the standard library; a module for identifying one or more non-critical timing paths in the initial circuit design, the non-critical timing paths including one or more, standard circuit cells; and a module for substituting the one or more standard circuit cells in at least one of the non-critical timing paths of the initial circuit design with one or more substitute circuit cells to form a modified integrated circuit design. In another example, the system may include a module for placing and routing the standard circuit cells of the initial circuit design, wherein the module for substituting substitutes the one or more standard cells after module for placing and routing has placed and routed the standard circuit cells.

Various embodiments of the present invention may be embodied as computer program products including a computer usable medium and computer readable code embodied on the computer usable medium, the computer readable code including computer readable program code devices configured to cause the computer to perform or effect one or more of the operations described herein.

The foregoing and other features, utilities and advantages of the invention will be apparent from the following more particular description of various embodiments of the invention as illustrated in the accompanying drawings and claims.

DETAILED DESCRIPTION

Disclosed herein are various embodiments of a method, system, and computer program product for designing an integrated circuit using a standard library and a substitute library. In one example, the standard library has a plurality of standard circuit cells, and the substitute library has a plurality of substitute circuit cells wherein one or more substitute circuit cells correspond to one or more standard circuit cells, and the one or more substitute circuit cells have at least one differing electrical characteristic (such as power consumption, quiescent current consumption, speed/response time, leakage current, etc.) than the corresponding standard circuit cells. An initial circuit design is created using the plurality of standard circuit cells of the standard library, and one or more non-critical timing paths are identified in the initial circuit design, the non-critical timing paths including one or more standard circuit cells. The one or more standard circuit cells in the non-critical timing paths of the initial circuit design are replaced with one or more substitute circuit cells to form a modified integrated circuit design. In this manner, the modified circuit design may include standard cells on the critical timing paths and substitute cells on the non-critical timing paths, wherein the standard cells are faster than the substitute cells, and the substitute cells consume less power and/or less quiescent current than the standard cells, in one example. Various embodiments of the present invention will now be described.

Figure 1:
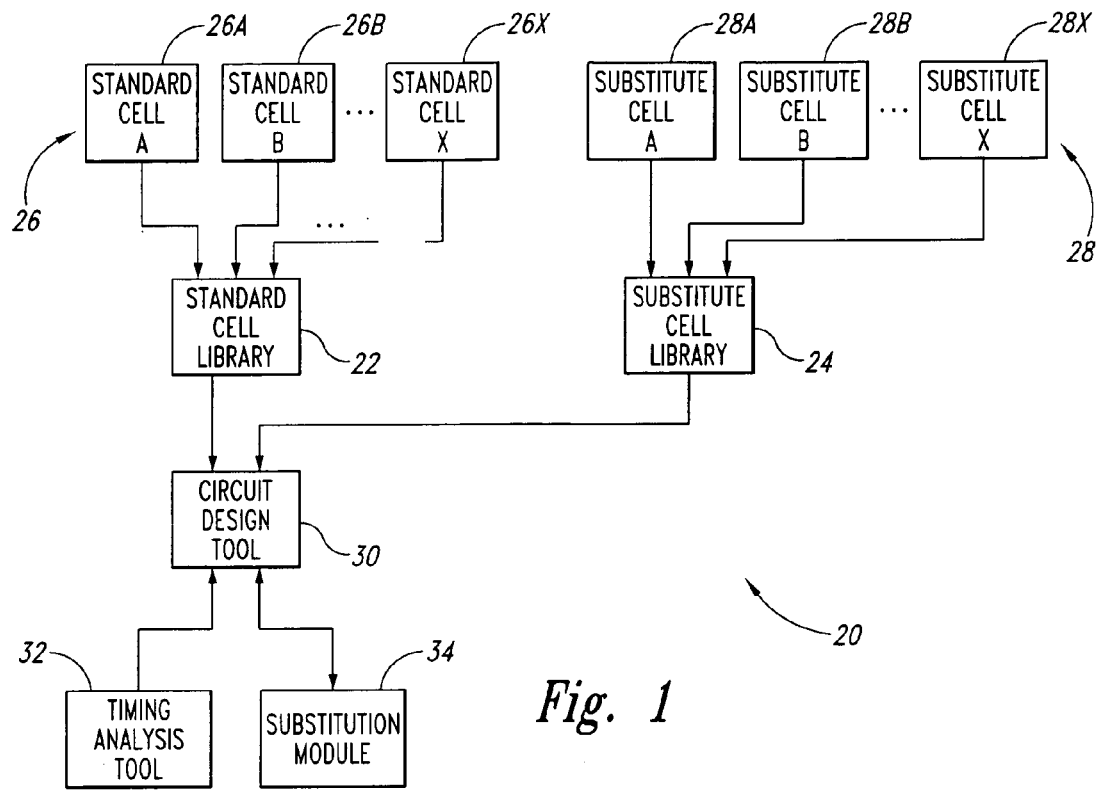
FIG. 1 illustrates a block diagram of a system for designing an integrated circuit using a standard cell library and a substitute cell library, in accordance with one embodiment of the present invention.

Referring to FIG. 1, a system 20 for designing an integrated circuit is illustrated, in accordance with one embodiment of the present invention. The system 20 includes a standard cell library 22 and a substitute cell library 24. The standard cell library 22 includes a plurality of standard cells or standard circuit cells 26, represented in FIG. 1 as standard cells 26 A, 26 B, and 26 X. A standard cell 26 may include, but is not limited to, circuit blocks which include one or more transistors configured in a manner to provide one or more functions for digital operations in the integrated circuit, and may include flip-flops, invertors, NAND gates, XOR gates, or other digital logic.

In accordance with one embodiment of the present invention, a substitute cell library 24 is provided in the system 20 for designing an integrated circuit. As shown in FIG. 1, a substitute library 24 includes a plurality of substitute cells 28, and in one embodiment one or more of the substitute cells 28 correspond to one or more of the standard cells 26 of the standard cell library 22. In one example, a substitute cell 28B performs the same or similar function as a corresponding standard cell 26B of the standard cell library 22, however, the substitute cell 28B may be formed using transistors having different electrical characteristics than the transistors utilized by the corresponding standard cell 26B. The different electrical characteristics may include power consumption, quiescent or bias current consumption, speed or response time, leakage current, and/or other characteristics of the transistors of a standard cell.

In one example, a copy of a standard cell library is created to form a substitute library, wherein the cells in the substitute library are provided using transistors having differing characteristics than the transistors used in the standard cells. For example, in one embodiment, the substitute cells 28 of the substitute library 24 have transistors wherein the N-core implant of each transistor is adjusted so as to reduce the power consumption and/or leakage characteristics of the transistor and any substitute cell including the modified transistor. As an example, a substitute cell of an XOR gate may be formed having transistors with modified N-core implants when compared with the transistors used by the standard cell library for the standard cell of an XOR gate, wherein the modified N-core implants of the substitute cell may be selected to reduce the amount of power consumption and/or quiescent current consumption of the XOR gate substitute cell. In this manner, the substitute cells 28 of the substitute library 24 have operating characteristics which are different than the operating characteristics of the corresponding standard cells 26 from the standard cell library 22. While the standard cell library 22 and the substitute cell library 24 have been shown and described as separate libraries, it is understood that these libraries could be combined into a single library, such as a single library having standard cells 26 and substitute cells 28.

The system 20 may also include a circuit design tool 30, a timing analysis tool 32, and a substitution module 34 in accordance with one embodiment of the present invention. The circuit design tool 30 may be a computer program or one or more computer program modules operating with a graphical user interface, or a programming interface in order to permit a circuit designer to design an integrated circuit using the standard library 22 and the substitute cell library 24. One example of a circuit design tool is Design Compiler provided by the Synopsys Corporation.

The timing analysis tool 32 permits a designer to perform timing analysis on one or more circuits which are part of an integrated circuit design, and such timing analysis may include static timing analysis or dynamic timing analysis in order to identify and characterize the timing and operations of various circuit paths in the integrated circuit design. In one embodiment, the timing analysis tool may include conventional processes such as timing slack analysis to determine critical and non-critical timing paths of a circuit. One example of a timing analysis tool is Prime Time provided by the Synopsys Corporation.

In one example, critical timing paths include any path in the integrated circuit in which the timing or performance of each of the elements or cells in the path just meets or barely meets the minimum timing requirement in order for the circuit to operate properly. A non-critical timing path may include any circuit path in the integrated circuit which is not a critical timing path or a path that has positive timing slack and therefore easily meets the timing requirements of the circuit. The determination of whether a path in an integrated circuit is a critical or non-critical timing path may be made using conventional tools, such as Prime Time from the Synopsys Corporation. Because circuit operations are measured with reference to a digital clock signal or an oscillator signal, it is possible that in a given circuit, certain paths are critical timing paths while other paths are non-critical timing paths depending upon the operating frequency and desired end use of the integrated circuit, and may further be based in part on timing requirements imposed by the systems in which an integrated circuit will be used.

In accordance with an embodiment of the present invention, the substitution module 34 may include one or more operations for substituting one or more standard cells in an integrated circuit design with one or more corresponding substitute cells 28 from the substitute library 24. These operations may include one or more of the operations described herein including with reference to FIG. 2. Because a substitute cell is provided having one or more differing electrical characteristics than a respective standard cell, the substitution module 34 permits a substitution of standard cells 26 with substitute cells 28 having differing characteristics. In one embodiment, the size (e.g., layout size) of the standard cells and the substitute cells are the same or approximately the same.

In effect, the substitution module 34 permits that transistors of a standard cell 26 may be substituted or replaced with transistors of a substitute cell 28 having equivalent functional characteristics but differing electrical characteristics in order to adjust one or more electrical characteristics of an integrated circuit design. In one example of a substitution, a substitute cell could use a set of transistors having modified "N-core" implants which make the transistors exhibit low current leakage properties or reduced quiescent current consumption. In this example, the substitute cell may be otherwise identical (i.e., same layout, same size, or same number of transistors, etc.) to the standard cell being substituted.

Accordingly, it can be seen that the system of FIG. 1 allows for a circuit designer to substitute one or more standard cells 26 used in an integrated circuit design with one or more corresponding substitute cells 28 used in a circuit path which has been identified by the timing analysis tool 32 as being a non-critical timing path. In this manner, system 20 permits a circuit designer to design a circuit using standard cells 26, perform a timing analysis, substitute one or more standard cells 26 in the non-critical timing paths of the circuit design with one or more corresponding substitute cells 28 from the substitute library 24, in order to form a modified integrated circuit design. The substitute cells 28 may be provided utilizing transistors having differing electrical characteristics than the transistors utilized in the corresponding standard cells 26. For example, a substitute cell 28 may include transistors having lower leakage characteristics relative to the leakage characteristics of the transistors used to form standard cells 26, or the substitute cells 28 may use transistors which have a lower power consumption characteristic when compared with the transistors used within a corresponding standard cell 26.

Accordingly, in one embodiment, the system 20 permits an integrated circuit designer, upon having designed an integrated circuit using standard cells 26, to create a modified integrated circuit design using a mix or combination of standard cells 26 and substitute cells 28. The modified integrated circuit design may have appropriate speed/performance characteristics in the critical timing paths, and low leakage/low power consumption characteristics in the non-critical circuit paths.

Figure 2:
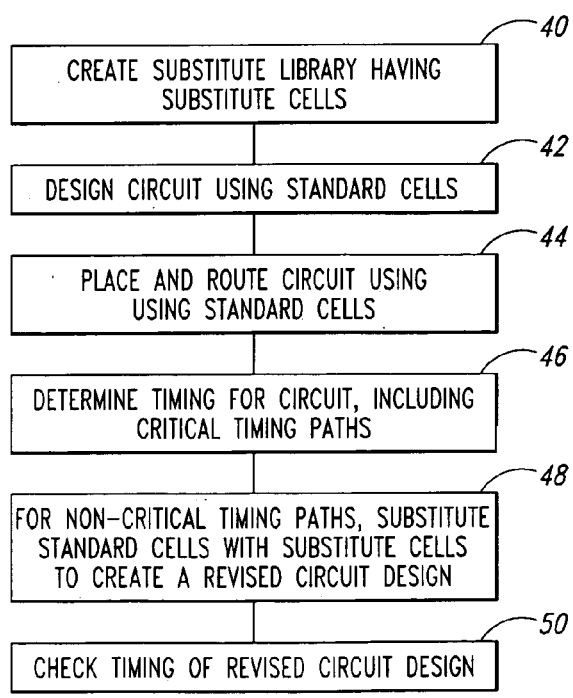
FIG. 2 illustrates an example of logical operations for designing an integrated circuit using a standard cell library and a substitute cell library, in accordance with one embodiment of the present invention.

FIG. 2 illustrates an example of logical operations for designing an integrated circuit using a mixture of standard cells and substitute cells, in accordance with one embodiment of the present invention. In the operations of FIG. 2, it is assumed that a standard cell library has been provided having a plurality of standard cells. At operation 40, a substitute library is created with substitute cells. In one example, the substitute library includes the same cells as in the standard cell library, except that each of the substitute cells includes transistors that have different electrical characteristics (i.e., lower quiescent current consumption) than the transistors used by the standard cells in the standard cell library.

At operation 42, a circuit design is created which uses the standard cells. In one example, operation 42 synthesizes the design to generate a gate level design of the circuit using the standard cell library. At operation 44, the circuit may be placed and routed using the standard cells from the standard cell library.

At operation 46, the timing is determined for the circuit having the standard cells. In one example, operation 46 performs a static timing analysis for each path in the design, and there may be thousands of paths in the design. Operation 46 determines the time critical paths for the design. These paths may include paths whose timing is critical to the successful operation of the circuit, and in one example, these paths are identified by examining the timing results of operation 46. Operation 46 also may identify non-critical timing paths in the circuit, as well the standard cells associated with the non-critical timing paths.

At operation 48, for the non-critical timing paths of the design, the standard cells on the non-critical timing paths are substituted with the corresponding and respective substitute cells from the substitute library of operation 40, to thereby form a revised circuit design which include standard cells on the critical paths and substitute cells on the non-critical paths.

At operation 50, the timing of the revised circuit design may be checked, measured, or determined in order to ensure that the revised circuit design, having a mixture of standard cells and substitute cells, satisfies the timing requirements for the circuit.

Figure 3:
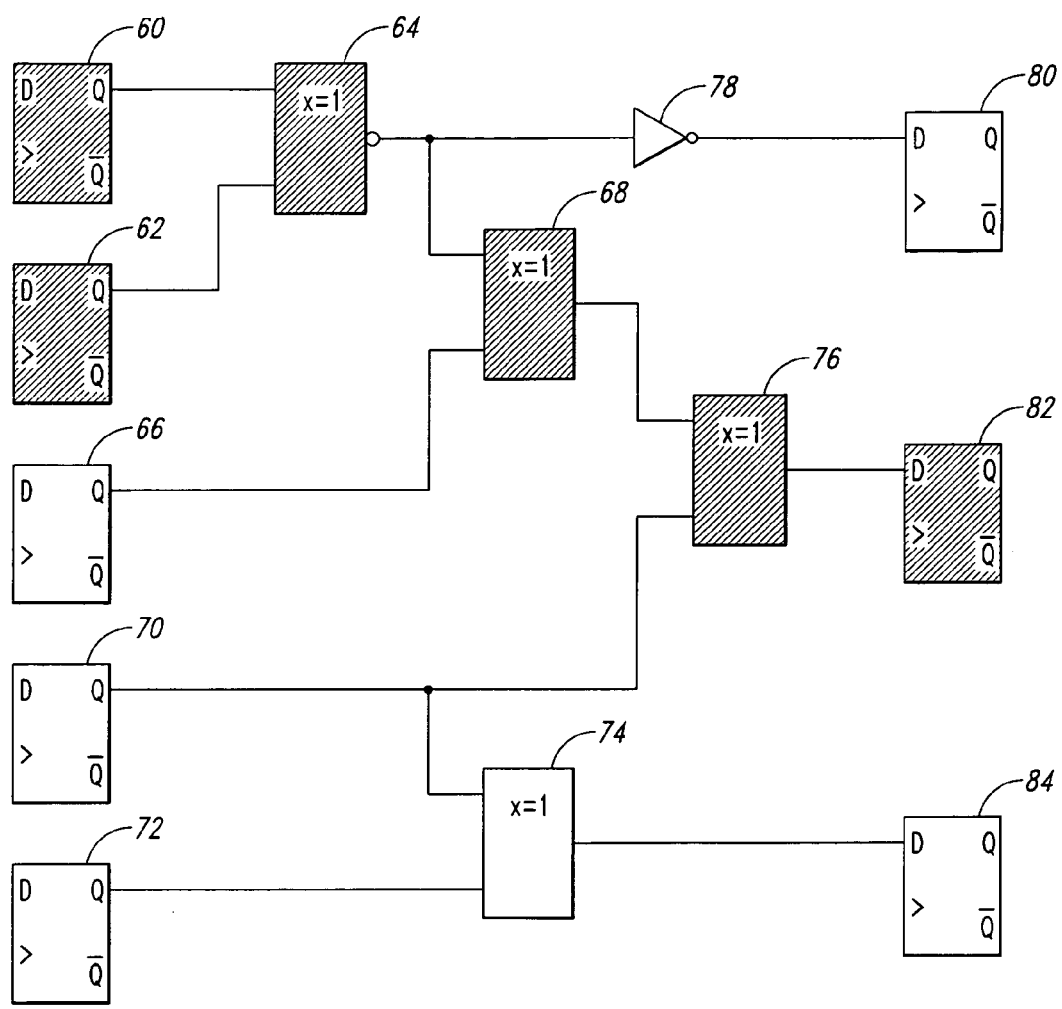
FIG. 3 illustrates an example of a circuit where critical and non-critical timing paths may be determined and standard sells may be substituted with substitute cells, in accordance with one embodiment of the present invention.

FIG. 3 illustrates an example of a circuit in which one or more of the operations and functions herein described may be utilized to create a modified integrated circuit design having a mixture of standard cells and substitute cells, in accordance with an embodiment of the present invention. In FIG. 3, it is assumed that the circuit shown initially include standard cells 26 (FIG. 1) for each of the circuit elements 60–84 shown therein.

Substitution module 34 of FIG. 1 permits the circuit designer to place and route the initial circuit using the standard cells (operation 44 of FIG. 2), in one example. The substitution module 34 may then provide for a timing analysis to be performed on the initial circuit to determine the timing characteristics of each of the circuit paths in the initial circuit (operation 46). In performing the timing analysis, timing analysis tool 32 may be utilized to identify critical and non-critical timing paths within the initial circuit. In the example of FIG. 3, the shaded circuit elements 60, 62, 64, 68, 76, and 82 have been identified as being associated with critical timing paths for the circuit, while the remaining elements of the circuit including elements 66, 70, 72, 74, 78, 80, and 82, have not been identified as being part of a critical timing path, and hence are considered part of non-critical timing paths.

Having identified the circuits elements which are part of the non-critical timing paths, substitution module 34 provides that the standard cells which are part of non-critical timing paths may be substituted using substitute cells having differing electrical characteristics, preferably having identical or similar functions as the corresponding standard cells which are being replaced (operation 48). In this manner, the substitution module 34 permits a circuit designer to create a revised circuit design including mixtures or combinations of standard cells and substitute cells. For instance, a designer may substitute a standard cell which uses high-power consumption, fast transistors with a substitute cell which uses low-power consumption, low current, slow transistors. In this example, the modified design would be more efficient in terms of current as compared to the initial design, and maintain the same overall performance.

In one embodiment, the substitution module 34 provides that another timing analysis may be performed to examine the timing characteristics of the revised circuit design so as to ensure that the revised circuit design still operates and performs within a criteria required of the integrated circuit (operation 50). In performing this timing analysis, timing analysis tool 32 may be utilized.

Accordingly, it can be seen that through the use of embodiments of the present invention, a circuit designer may design an integrated circuit or portions thereof using high performance standard cells in combination with substitute cells which exhibit lower power consumption and/or lower quiescent current consumption. The resulting integrated circuit design retains the performance characteristics of the design as if the circuit design been made using only the standard cell library, while additionally achieving the benefits of reduced leakage currents and/or reduced power consumption.

Embodiments of the present invention may be used in the design of integrated circuits, including but not limited to programmable logic devices, microprocessors, microcontrollers, application specific integrated circuits, memory devices, discrete logic devices, or any other integrated circuit. As used herein, the term "transistor" includes any switching element which may include, for example, N-channel or P-channel CMOS transistors, MOSFETs, FETs, JFETs, BJTs or other like switching element or device. The particular type of transistor involved is a matter of choice depending upon the particular application of the integrated circuit, and may be based in part on factors such as power consumption limits, response times, noise immunity, fabrication considerations, etc.

Various embodiments of the present invention may be embodied as computer program products including a computer usable medium (such as disk or tape media, CDROMS, memory devices encoded with program operations thereon, or other medium readable by a computer) and computer readable code embodied on the computer usable medium, the computer readable code including computer readable program code devices configured to cause the computer to perform or effect one or more of the operations described herein. Further, one or more of the operations or features described herein may be implemented using one or more modules adapted to operate in a computer system.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

While the invention has been particularly shown and described with reference to a preferred embodiment thereof, it will be understood by those skilled in the art that various other changes in the form and details may be made without departing from the spirit and scope of the invention.

We claim:

1. A method for designing an integrated circuit, the method comprising:
   providing a first library having a plurality of standard circuit cells;
   providing a second library having a plurality of substitute circuit cells wherein one or more substitute circuit cells correspond to one or more standard circuit cells and the one or more substitute circuit cells have at least one differing electrical characteristic than the corresponding one or more standard circuit cells;
   creating an initial circuit design using the plurality of standard circuit cells of the first library;
   identifying one or more non-critical timing paths in the initial circuit design, the non-critical timing paths including one or more standard circuit cells, wherein said identifying operation occurs after the operation of providing the second library; and
   providing for substituting the one or more standard circuit cells in at least one of the non-critical timing paths of the initial circuit design with one or more substitute circuit cells to form a modified integrated circuit design.

2. The method of claim 1, wherein the standard circuit cells include a first set of transistors having a plurality of electrical characteristics, and the substitute circuit cells corresponding to the standard circuit cells include a second set of transistors having a plurality of electrical characteristics, the electrical characteristics of the first set of transistors being different from the electrical characteristics of the second set of transistors.

3. The method of claim 2, wherein one of the electrical characteristics of the first and second set of transistors includes an amount of power consumed during operating, the amount of power consumed by the second set of transistors being lower than the amount of power consumed by the first set of transistors.

4. The method of claim 2, wherein one of the electrical characteristics of the first and second set of transistors includes an amount of quiescent current used during operating, the amount of quiescent current used by the second set of transistors being lower than the amount of quiescent current used by the first set of transistors.

5. The method of claim 2, wherein one of the electrical characteristics of the first and second set of transistors includes a response time, the response time of the first set of transistors being faster than the response time of the second set of transistors.

6. The method of claim 1, wherein the standard circuit cells include a first set of transistors having a first type of implant, and the substitute circuit cells corresponding to the standard cells include a second set of transistors having a second type of implant, the second type of implant being different from the first type of implant.

7. The method of claim 1, wherein the standard circuit cells include a first set of transistors configured to perform a logical function, and the substitute circuit cells corresponding to the standard cells include a second set of transistors configured to perform the logical function.

8. The method of claim 1, wherein the operation of providing a second library includes:
  copying the plurality of standard circuit cells of the first library, wherein the standard circuit cells include a first set of transistors having a plurality of electrical characteristics; and
  replacing the first set of transistors with a second set of transistors having a plurality of electrical characteristics being different from the electrical characteristics of the first set of transistors.

9. The method of claim 1, wherein the operation of identifying one or more non-critical timing paths includes:
  identifying one or more critical timing paths in the initial circuit design.

10. The method of claim 1, wherein the operation of identifying one or more non-critical timing paths in the initial circuit design includes:
  performing a static timing analysis of the initial circuit design.

11. The method of claim 1, further comprising:
  placing and routing the standard circuit cells of the initial circuit design; and
  substituting the one or more standard circuit cells after the placing and routing has occurred.

12. The method of claim 1, further comprising:
  evaluating the modified circuit design in order to determine whether the modified circuit design performs in a manner consistent with the initial circuit design.

13. A system for designing an integrated circuit, comprising:
  standard library having a plurality of standard circuit cells;
  substitute library having a plurality of substitute circuit cells wherein one or more substitute circuit cells correspond to one or more standard circuit cells and the one or more substitute circuit cells have at least one differing electrical characteristic than the corresponding one or more standard circuit cells;
  a module for creating an initial circuit design using the plurality of standard circuit cells of the standard library;
  a module for identifying one or more non-critical timing paths in the initial circuit design, the non-critical timing paths including one or more standard circuit cells;
  a module for substituting the one or more standard circuit cells in at least one of the non-critical timing paths of the initial circuit design with one or more substitute circuit cells to form a modified integrated circuit design; and
  a module for placing and routing the standard circuit cells of the initial circuit design;
  wherein the module for substituting substitutes the one or more standard cells after the module for placing and routing has placed and routed the standard circuit cells.

14. The system of claim 13, wherein the standard circuit cells include a first set of transistors having a plurality of electrical characteristics, and the substitute circuit cells corresponding to the standard circuit cells include a second set of transistors having a plurality of electrical characteristics, the electrical characteristics of the first set of transistors being different from the electrical characteristics of the second set of transistors.

15. The system of claim 14, wherein one of the electrical characteristics of the first and second set of transistors includes an amount of power consumed during operating, the amount of power consumed by the second set of transistors being lower than the amount of power consumed by the first set of transistors.

16. The system of claim 14, wherein one of the electrical characteristics of the first and second set of transistors includes an amount of quiescent current used during operating, the amount of quiescent current used by the second set of transistors being lower than the amount of quiescent current used by the first set of transistors.

17. The system of claim 14, wherein one of the electrical characteristics of the first and second set of transistors includes a response time, the response time of the first set of transistors being faster than the response time of the second set of transistors.

18. The system of claim 13, wherein the standard circuit cells include a first set of transistors having a first type of implant, and the substitute circuit cells corresponding to the standard cells include a second set of transistors having a second type of implant, the second type of implant being different from the first type of implant.

19. A computer program product comprising:
  a computer usable medium and computer readable code embodied on the computer usable medium for designing an integrated circuit, the computer readable code comprising:
  computer readable program code devices configured to include a first library having a plurality of standard circuit cells;
  computer readable program code devices configured to include a second library having a plurality of substitute circuit cells wherein one or more substitute circuit cells correspond to one or more standard circuit cells and the one or more substitute circuit cells have at least one differing electrical characteristic than the corresponding one or more standard circuit cells;
  computer readable program code devices configured to cause the computer to effect a creation of an initial circuit design using the plurality of standard circuit cells of the first library;
  computer readable program code devices configured to cause the computer to effect an identification of one or more non-critical timing paths in the initial circuit design, the non-critical timing paths including one or more standard circuit cells;
  computer readable program code devices configured to cause the computer to effect a substitution of the one or more standard circuit cells in at least one of the non-critical timing paths of the initial circuit design with one or more substitute circuit cells to form a modified integrated circuit design; and computer readable program code devices configured to cause the computer to effect placing and routing of the standard circuit cells of the initial circuit design;

wherein the computer readable program code devices configured to cause the computer to effect a substitution are configured to substitute the one or more standard cells after the computer has placed and routed the standard circuit cells.

* * * * *